US011967801B2

(12) United States Patent
Abedin et al.

(10) Patent No.: US 11,967,801 B2
(45) Date of Patent: Apr. 23, 2024

(54) SEMICONDUCTOR DEVICES FOR LASING APPLICATIONS AND METHODS OF MANUFACTURING SUCH DEVICES

(71) Applicant: NanoPro AB, Solna (SE)

(72) Inventors: Ahmad Abedin, Kista (SE); Mikael Östling, Kista (SE)

(73) Assignee: NanoPro AB, Solna (SE)

( * ) Notice: Subject to any disclaimer, the term of this patent is extended or adjusted under 35 U.S.C. 154(b) by 779 days.

(21) Appl. No.: 17/048,498

(22) PCT Filed: Mar. 28, 2019

(86) PCT No.: PCT/EP2019/057930
§ 371 (c)(1),
(2) Date: Oct. 16, 2020

(87) PCT Pub. No.: WO2019/201570
PCT Pub. Date: Oct. 24, 2019

(65) Prior Publication Data
US 2021/0104871 A1    Apr. 8, 2021

(30) Foreign Application Priority Data

Apr. 18, 2018   (SE) .................................. 1850450-6

(51) Int. Cl.
*H01S 5/30* (2006.01)
*H01S 5/20* (2006.01)
*H01S 5/32* (2006.01)

(52) U.S. Cl.
CPC .......... *H01S 5/3027* (2013.01); *H01S 5/2086* (2013.01); *H01S 5/3223* (2013.01)

(58) Field of Classification Search
CPC .... H01S 5/3027; H01S 5/2086; H01S 5/3223; H01S 5/3201; H01L 21/0245;
(Continued)

(56) References Cited

U.S. PATENT DOCUMENTS 5,548,128 A     8/1996  Soref et al.
6,316,770 B1 *  11/2001 Ouvrier-Buffet ......... G01J 5/20
                                                  250/336.1
(Continued)

OTHER PUBLICATIONS

International Search Report and Written Opinion for PCT Application No. PCT/EP2019/057930, dated Jul. 3, 2019, 12 pages.
(Continued)

*Primary Examiner* — Vu A Vu
(74) *Attorney, Agent, or Firm* — Brake Hughes Bellermann LLP

(57) ABSTRACT

A structure having first and second layers is disposed on a substrate. The second layer is disposed on the first layer, is compressively strained, and comprises the alloy including germanium and tin. The structure comprises first and second members spaced a distance from each other along a direction, a strip located between the first and second members and extending along an axis intersecting the direction, and arms connecting the first and second members to a first end of the strip. The first and second members, the strip and the arms comprise respective portions of the first and second layers. A portion of the first layer at the strip and arms is removed such that the strip and arms become suspended and the arms remain anchored to the first layer via the first and second members. Tensile strain is induced in the alloy via the arms. The alloy may perform lasing.

19 Claims, 6 Drawing Sheets

(58) Field of Classification Search
CPC ......... H01L 21/02494; H01L 21/02532; H01L 21/02535; H01L 21/02587; H01L 21/02664; H01L 21/02381
USPC ...................................................... 372/43.01
See application file for complete search history.

(56) References Cited

U.S. PATENT DOCUMENTS

| | | | | |
|---|---|---|---|---|
| 6,465,355 | B1* | 10/2002 | Horsley | B81C 1/00142 438/700 |
| 6,927,392 | B2 | 8/2005 | Liddiard | G01J 5/20 257/E31.093 |
| 8,349,667 | B2* | 1/2013 | Saracco | B82Y 10/00 257/E21.123 |
| 8,449,177 | B2* | 5/2013 | Kvisteroy | G01L 21/00 374/185 |
| 9,097,579 | B2* | 8/2015 | Hou | G01J 5/10 |
| 9,203,215 | B2* | 12/2015 | Makino | H01S 5/18311 |
| 9,368,658 | B2* | 6/2016 | Purkl | G01J 5/045 |
| 9,774,167 | B2* | 9/2017 | Gassenq | H01L 33/26 |
| 10,290,548 | B2* | 5/2019 | Chiang | H01L 29/78696 |
| 10,777,852 | B2* | 9/2020 | Woodford | H01M 10/445 |
| 10,840,399 | B1* | 11/2020 | Rana | G01J 5/024 |
| 2004/0232504 | A1 | 11/2004 | Lal et al. | |
| 2015/0372455 | A1 | 12/2015 | Nam et al. | |
| 2017/0093130 | A1 | 3/2017 | Gassenq et al. | |
| 2018/0287220 | A1* | 10/2018 | Woodford | H01M 10/0431 |

OTHER PUBLICATIONS

R. Soref et al., "Direct-Gap GE/GESN/SI and GESN/GE/SI Heterostructures", Superlattices and Microstructures, vol. 14, No. 2/3; XP000465270, 1993, pp. 189-193.

M.J. Süess et al.: "Analysis of enhanced light emission from highly strained germanium microbridges," Nature Photonics, vol. 7, Jun. 2013, pp. 466-472.

A. Gassenq et al.: "Raman-strain relations in highly strained Ge: Uniaxial <100>, <110> and biaxial (001) stress," J. Appl. Phys. 121, 055702, Feb. 1, 2017, 9 pages.

A. Gassenq et a.: "1.9% bi-axial tensile strain in thick germanium suspended membranes fabricated in optical germanium-on-insulator substrates for laser applications," Appl. Phys. Lett. 107, 191904, Nov. 11, 2015, 5 pages.

D.S. Sukhdeo et al.: "Direct bandgap germanium-on-silicon inferred from 5.7% <100> uniaxial tensile strain [Invited]," Photon. Res., vol. 2, No. 3, Jun. 2014, pp. A8-A13.

A. Gassenq et al.: "Accurate strain measurements in highly strained Ge microbridges," Appl. Phys. Lett., vol. 108, 241902, Jun. 13, 2016, 5 pages.

D.S. Sukhdeo et al.: "Direct Bandgap Germanium Nanowires Inferred from 5.0% Uniaxial Tensile Strain," IEEE Int. Conf. Gr. IV Photonics GFP, vol. 2, 2013, pp. 73-74.

T. Etzelstorfer et al.: "Scanning X-ray strain microscopy of inhomogeneously strained Ge micro-bridges," Journal of Synchrotron Radiation, vol. 21, No. 1, 2014, pp. 111-118.

M. El Kurdi: "Direct Band Gap Germanium Microdisks Obtained with Silicon Nitride Stressor Layers," ACS Photonics, vol. 3, No. Feb. 3, 2016, pp. 443-448.

Y. Kim et al.: "Strained Ge Light Emitter with Ge on Dual Insulators for Improved Thermal Conduction and Optical Insulation," IEIE Transactions on Smart Processing and Computing, vol. 4, No. 5, Oct. 2015, pp. 318-323.

A. Ghrib et al.: "All-Around SiN Stressor for High and Homogeneous Tensile Strain in Germanium Microdisk Cavities," Adv. Optical Mater., vol. 3, No. 3, 2015, pp. 353-358.

S. Wirths et al.: "Lasing in direct-bandgap GeSn alloy grown on Si," Nature Photonics, vol. 9, Feb. 2015, pp. 88-92.

D. Strange et al.: "Optically Pumped GeSn Microdisk Lasers on Si," ACS Photonics, vol. 3, Jun. 24, 2016, pp. 1279-1285.

S. Gupta: "No Title," PhD Thesis, Aug. 2013, 173 pages.

R. Chen et al.: "Demonstration of a Ge/GeSn/Ge Quantum-Well Microdisk Resonator on Silicon: Enabling High-Quality Ge(Sn) Materials for Micro- and Nanophotonics," Nano Lett., vol. 14, Dec. 3, 2013, pp. 37-43.

S. Wirths et al.: "Si—Ge—Sn alloys: From growth to applications," Progress in Crystal Growth and Characterization of Materials, vol. 62, 2016, pp. 1-39.

N. von den Driesch et al.: "Direct Bandgap Group IV Epitaxy on Si for Laser Applications," Chem. Mater., vol. 27, 2015, pp. 4693-4702.

D.S. Sukhdeo et al.: "Approaches for a Viable Germanium Laser: Tensile Strain, GeSn Alloys, and n-Type Doping," IEEE 2013, pp. 112-113.

D. Grützmacher et al.: "On the Track towards an Electrically Pumped Group IV Laser," 2016 IEEE Silicon Nanoelectronics Workshop (SNW), Honolulu, HI, 2016, pp. 124-125.

S. Wirths et al.: "GeSn Fabry-Perot Waveguide Lasers for Monolithic Integration on Si," IEEE 2015, pp. 92-93.

Z. Huang et al.: "Emission of direct-gap band in germanium with Ge—GeSn layers on one-dimensional structure," Nature Scientific Reports, vol. 6:24802, Apr. 21, 2016, 7 pages.

Meng et al.: "Core-Shell Germanium/Germanium-Tin Nanowires Exhibiting Room-Temperature Direct- and Indirect-Gap Photoluminescence," Nano Lett., vol. 16, 2016, pp. 7521-7529.

Nam et al.: "Strained Ge Nanowire with High-Q Optical Cavity for Ge Laser Applications," IEEE 2015, 2 pages.

* cited by examiner

SEMICONDUCTOR DEVICES FOR LASING APPLICATIONS AND METHODS OF MANUFACTURING SUCH DEVICES

CROSS REFERENCE TO RELATED APPLICATIONS

This application is a 35 U.S.C. § 371 National Phase Entry Application from PCT Application No. PCT/EP2019/057930, filed on Mar. 28, 2019, entitled "SEMICONDUCTOR DEVICES FOR LASING APPLICATIONS AND METHODS OF MANUFACTURING SUCH DEVICES", and designating the U.S., which claims priority to Swedish Application No. 1850450-6, filed on Apr. 18, 2018, the disclosures of which are incorporated herein in their entireties by reference.

TECHNICAL FIELD

The present disclosure generally relates to the field of semiconductor technology, and more specifically to semiconductor devices for lasing applications.

BACKGROUND

The continuous increase in the integration density and complexity of complementary metal-oxide-semiconductor (CMOS) circuits challenges materials science and physics. The signal propagation delay in interconnects needs to decrease in order to benefit from the increasing switching speed of transistors. Despite the ever growing packing densities and operating frequencies, electrical wiring limits the performance of the newest generation of processors by limiting the bandwidth of on-chip data transfer. Optical interconnection for on-chip communication as well as optical data transfer is therefore a promising alternative for CMOS-based devices. It may improve noise immunity and enhance signal synchronization, while lowering power dissipation. Nearly all the main components for monolithic optical interconnects on a silicon (Si) platform have been demonstrated, including photodetectors, waveguides, and modulators. The only exception is an efficient light emitter. Laser devices using III-V semiconductors on Si have been demonstrated, but because of integration challenges and high costs, such devices have rarely been incorporated into Si-based CMOS technology.

Recently, germanium (Ge) has been considered as a promising candidate to overcome this obstacle because of its compatibility with standard CMOS technology. Strain relaxed bulk Ge is an indirect bandgap semiconductor with a slight difference between its direct band gap at the Γ valley (0.86 eV) and its indirect bandgap at the L-valley (0.66 eV). Different ways of manipulating the energy band structure of Ge have been proposed for transferring Ge from indirect to direct bandgap semiconductor.

One approach proposed in an article entitled "Lasing in direct-bandgap GeSn alloy grown on Si" by S. Wirths et al., and published in Nat. Photonics. vol. 9, no. 2, pp. 88-92, 2015, is alloying Ge with tin (Sn). A direct bandgap material was obtained by growing a 600 nm thick GeSn layer with 12% Sn content epitaxially on a Ge buffered Si wafer. The reason for such a high thickness is that a GeSn layer on Ge is highly compressively strained (about 1.5%) which results in an indirect bandgap semiconductor. By increasing the thickness of the GeSn layer, the compressive strain relaxes partially and the GeSn layer becomes direct bandgap. However, the high thickness induces a large number of defects and degrades the crystal quality of the GeSn layer. Thus, the GeSn layer can lase only at very low temperatures (below 100 K), and with very high threshold.

It would therefore be desirable to provide devices and manufacturing methods for addressing one or more of the above mentioned problems.

SUMMARY

It is an object of the present disclosure to provide devices and manufacturing methods for addressing one or more of the above mentioned problems.

Hence, a first aspect of the present disclosure provides embodiments of a manufacturing method which comprises providing a structure disposed on a substrate. The structure has a first layer and a second layer. The first layer is a sacrificial layer. The second layer is a compressively strained layer disposed on the first layer. The second layer comprises an alloy including germanium (Ge) and tin (Sn). The structure comprises first and second members spaced a distance from each other along a direction, a strip (or wire) located between the first and second members and extending along an axis intersecting the direction (or being arranged at an angle relative to the direction), and arms connecting the first and second members to a first end of the strip. The first and second members, the strip and the arms comprise respective portions of the first and second layers. The manufacturing method comprises removing at least a portion of the first layer at the strip and arms such that the strip and arms become suspended and the arms remain anchored to the first layer via the first and second members.

After removal of at least a portion of the first layer, the arms pull at the first end of the strip such that tensile strain is induced in the second layer of the strip (which comprises an alloy comprising Ge and Sn). The tensile strain allows the alloy in the second layer to become a direct bandgap material. The tensile strained alloy in the second layer may for example perform lasing at higher temperatures than the earlier solution described in the background section.

The alloy in the second layer may for example comprise one or more elements in addition to germanium and tin, such as Si.

The structure may for example comprise means for restricting motion of the second end of the strip along the axis, so that the strip is prevented from moving (or from being translated) in the axial direction when the arms pull at the first end of the strip. The means for restricting motion of the second end of the strip along the axis may for example include an anchoring member arranged to anchor the second end of the strip to the first layer, or one or more additional arms connecting the second end of the strip to an anchoring member arranged to anchor the one or more additional arms to the first layer.

The axis may for example form a non-zero angle relative to the direction. The axis may for example be non-parallel to the direction. The axis may for example be orthogonal to the direction.

The substrate may for example comprise Si or Ge.

According to some embodiments, the removal of at least a portion of the first layer may cause at least part of the compressive strain in the second layer of the strip and arms to be released. The release of compressive strain may cause the arms to lengthen and to pull at the first end of the strip such that tensile strain is induced in the strip along said axis.

According to some embodiments, providing the structure may comprise providing a substrate on which the first and second layers are disposed, and removing material via etching from at least the second layer to form at least the strip, the arms, and the first and second members in at least the second layer. Further elements (such as an anchoring member, additional arms, and/or third and second members) may for example also be formed via the etching.

The etching may for example be employed to remove material from the first and second layers to form the strip, the arms, and the first and second members in the first and second layers.

The etching may for example remove material from the second layer (and not the first layer) to form the strip, the arms, and the first and second members in the second layer. Material may for example be removed from the first layer in a subsequent step.

According to some embodiments, the removal of at least a portion of the first layer may be performed via selective etching of the first layer.

The etching may for example be adapted not to remove material from the second layer.

The first and second members may for example be so large (or so broad, or so wide, in comparison to the other elements such as the strip) that even if the etching affects (or removes) portions of the first layer at the first and second members, some portions of the first layer still remain at the first and second members after the etching.

According to some embodiments, the first layer may be a germanium layer or an insulator layer such as, for example, Si oxide, aluminum (Al) oxide or Ge oxide (metal oxides). The first layer may for example be referred to as a buffer layer.

According to some embodiments, the substrate may be arranged along a plane. The direction and the axis may be parallel to the plane. The strip, the arms and the first and second members may for example be distributed along a plane parallel to the substrate.

According to some embodiments, the structure may further comprise additional arms connecting the first and second members to a second end of the strip. The additional arms may comprise respective portions of the first and second layers. The method may comprise removing at least a portion of the first layer at the strip, arms, and additional arms such that the strip, arms, and additional arms become suspended and the arms and the additional arms remain anchored to the first layer via the first and second members.

According to some embodiments, the arms and the additional arms together form a closed loop around the strip.

According to some embodiments, the arms, the additional arms, and at least one of the first and second members together form a closed loop around the strip.

According to some embodiments, the structure may comprise third and fourth members spaced a distance from each other along the direction. The strip may be located between the third and fourth members. The structure may comprise additional arms connecting the third and fourth members to a second end of the strip. The third and fourth members and the additional arms may comprise respective portions of the first and second layers. The method may comprise removing at least a portion of the first layer at the strip, arms, and additional arms such that the strip, arms, and additional arms become suspended, the arms remain anchored to the first layer via the first and second members, and the additional arms remain anchored to the first layer via the third and fourth members.

According to some embodiments, the removal of at least a portion of the first layer may cause at least part of the compressive strain in the second layer of the strip, arms, and additional arms to be released. The release of compressive strain may cause the arms to lengthen and to pull at the first end of the strip, and may cause the additional arms to lengthen and to pull at the second end of the strip, such that tensile strain is induced in the strip along the axis.

According to some embodiments, the structure may further comprise an anchoring member connected to a second end of the strip. The anchoring member may comprise portions of the first and second layers. The method may comprise removing at least a portion of the first layer at the strip and arms such that the strip and arms become suspended, the strip remains anchored to the first layer via the anchoring member, and the arms remain anchored to the first layer via the first and second members.

According to some embodiments, the second layer may include a plurality of sublayers arranged as a stack of sublayers of a first type and sublayers of a second type disposed sequentially on top of each other. The first type of sublayers may be germanium sublayers. The second type of sublayers may comprise an alloy including germanium and tin.

A second aspect of the present disclosure provides embodiments of a device which comprises a substrate and a structure disposed on the substrate. The structure comprises first and second members spaced a distance from each other along a direction, a strip (or wire) located between the first and second members and extending along an axis intersecting the direction (or being arranged at an angle relative to the direction), and arms connecting the first and second members to a first end of the strip. The first and second members comprise respective portions of a first layer. The first layer is a sacrificial layer. The first and second members, the strip and the arms comprise respective portions of a second layer. The second layer comprises an alloy including germanium and tin. The portions of the second layer located in the first and second members are disposed on the respective portions of the first layer located in the first and second members. The portions of the second layer located in the first and second members are compressively strained. The strip and arms are suspended above the substrate. The arms are anchored to the first layer via the first and second members.

Embodiments of the device according to the second aspect may for example be obtained via use of the manufacturing method according to any one of the embodiments of the first aspect.

The effects and/or advantages presented above for embodiments of the method according to the first aspect may also apply to corresponding embodiments of the device according to the second aspect.

The strip and arms may for example be separated from the substrate by an opened space (or gap). The opened space may for example be filled by air or some other gas.

The strip and the arms may for example lack the first layer. The portions of the second layer located in the strip and arms may for example be suspended above the substrate.

The structure may for example comprise means for restricting motion of the second end of the strip along the axis, so that the strip is prevented from moving (or from being translated) in the axial direction. The means for restricting motion of the second end of the strip along the axis may for example include an anchoring member arranged to anchor the second end of the strip to the first layer, or one or more additional arms connecting the second end of the strip to an anchoring member arranged to anchor the one or more additional arms to the first layer.

The axis may for example form a non-zero angle relative to the direction. The axis may for example be non-parallel to the direction. The axis may for example be orthogonal to the direction.

According to some embodiments, the arms may pull at the first end of the strip such that tensile strain is induced in the strip along the axis.

According to some embodiments, the direction and the axis may both be parallel to the plane.

According to some embodiments, the structure may further comprise additional arms connecting the first and second members to a second end of the strip. The additional arms may comprise respective portions of the second layer. The additional arms may be suspended above the substrate and may be anchored to the first layer via the first and second members.

According to some embodiments, the structure may comprise third and fourth members spaced a distance from each other along the direction. The strip may be located between the third and fourth members. The third and fourth members may comprise respective portions of the first and second layers. The portions of the second layer located in the third and fourth members may be disposed on the respective portions of the first layer located in the third and fourth members. The portions of the second layer located in the third and fourth members may be compressively strained. The structure may comprise additional arms connecting the third and fourth members to a second end of the wire. The additional arms may comprise respective portions of the second layer. The additional arms may be suspended above the substrate and may be anchored to the first layer via the third and fourth members.

According to some embodiments, the additional arms may pull at the second end of the strip such that tensile strain is induced in the strip along the axis.

According to some embodiments, the structure may comprise an anchoring member connected to a second end of the strip. The anchoring member may comprise portions of the first and second layers. The portion of the second layer located in the anchoring member may be disposed on the portion of the first layer located in the anchoring member. The portion of the second layer located in the anchoring member may be compressively strained. The second end of the strip may be anchored to the first layer via the anchoring portion.

According to some embodiments, the second layer may be at most 400 nm thick, or at most 200 nm or at most 100 nm, or at most 50 nm.

According to some embodiments, the second layer may comprise a sublayer which is at most 400 nm thick. The sublayer may comprise an alloy including germanium and tin.

If a too thick GeSn layer is employed, the crystal quality of the GeSn may degrade. Use of a thin GeSn layer is therefore preferable. The tensile strain induced by the arms allows for use of a thinner GeSn layer compared to the prior art solution mentioned in the background section.

According to some embodiments, the structure may occupy (or fit within) an area of less than 50 μm times 50 μm. The structure may for example occupy an area of less than 40 μm times 40 μm, less than 30 μm times 30 μm, or 20 μm times 20 μm. The small dimensions of the structure mean that quite little space is required to provide the strip with the tensile strained second layer comprising an alloy including Ge and Sn.

According to some embodiments, a distance between the first member and the second member may be less than two times a length of the strip.

According to some embodiments, the strip may be between 0.1 μm and 10 μm wide.

According to some embodiments, the second layer may have at least 5 atomic percent tin. In some embodiments, the second layer may have between 5 and 20 atomic percent tin.

According to some embodiments, the second layer may comprise a sublayer which has at least 5 atomic percent tin. In some embodiments, the sublayer may have between 5 and 20 atomic percent tin. The sublayer may comprise an alloy including germanium and tin.

According to some embodiments, the second layer may include a plurality of sublayers arranged as a stack of sublayers of a first type and of a second type disposed sequentially on top of each other. The first type of sublayers may be germanium sublayers. The second type of sublayers may comprise an alloy including germanium and tin.

A third aspect of the present disclosure provides embodiments of an infrared device which comprises the device as defined in any one of the embodiments of the second aspect. The strip may be arranged to be employed as an infrared light source.

A fourth aspect of the present disclosure provides embodiments of a photodetector which comprises the device as defined in any one of the embodiments of the second aspect. The strip may be arranged to be employed as an infrared absorber.

It will be appreciated that embodiments of the present disclosure relate to all possible combinations of features recited in the claims. Further, it will be appreciated that features described in connection with the first aspect of the present disclosure may be combined with embodiments of the second, third and fourth aspects of the present disclosure, and vice versa.

BRIEF DESCRIPTION OF THE DRAWINGS

In what follows, example embodiments will be described in greater detail with reference to the accompanying drawings, on which.

All the figures are schematic, not necessarily to scale, and generally only show parts which are necessary in order to elucidate the respective embodiments, whereas other parts may be omitted or merely suggested.

DETAILED DESCRIPTION

Figure 1:
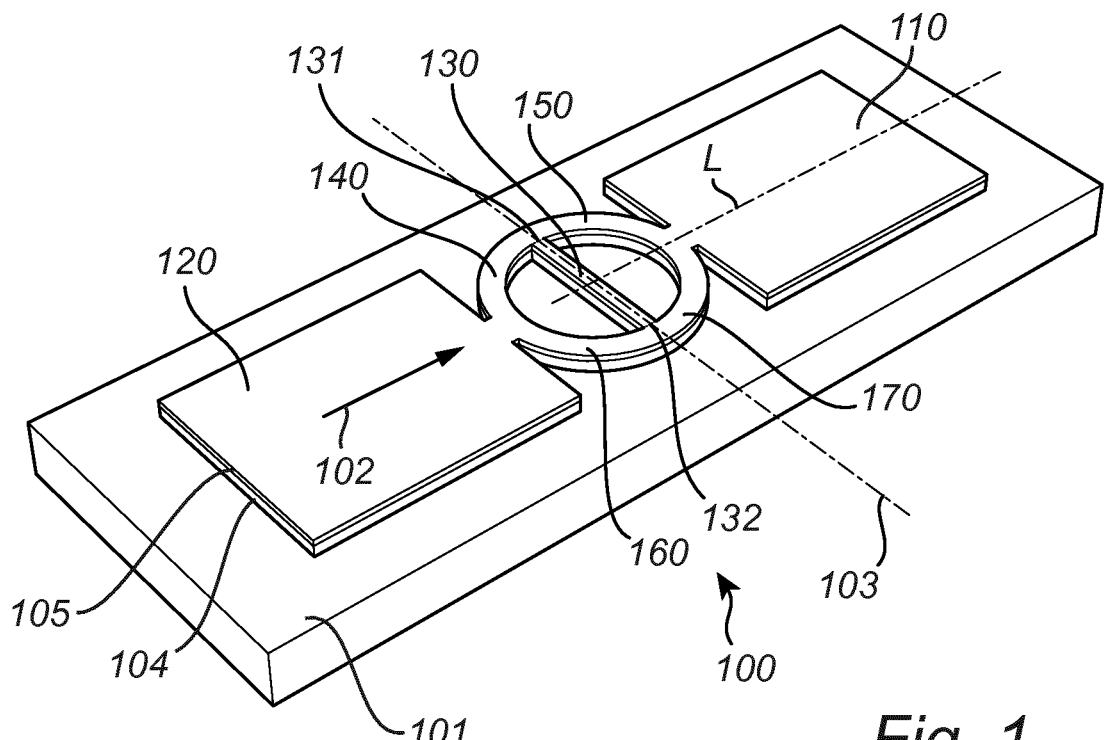
FIG. 1 is a perspective view of a structure for inducing tensile strain in a layer comprising an alloy including germanium and tin (Sn), according to an embodiment.
Figure 2:
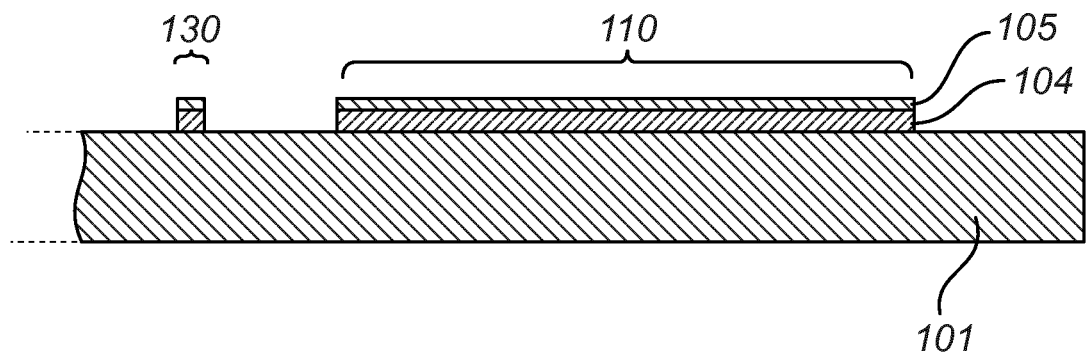
FIG. 2 is a cross sectional view of the structure in FIG. 1 along the line L.

FIG. 1 is a perspective view of a structure 100 for inducing tensile strain in a layer comprising an alloy including germanium (Ge) and tin (Sn), according to an embodiment. FIG. 2 is a cross sectional view of the structure 100 in FIG. 1 along the line L. The structure 100 is disposed on a substrate 101. The structure 100 comprises a first member 110 and a second member 120 spaced a distance from each other along a direction 102, and a strip 130 located between the first member 110 and the second member 120. The strip 130 extends along an axis 103 intersecting the direction 102. The structure 100 comprises arms 140 and 150 connecting the first member 110 and the second member 120 to a first end 131 of the strip 130, and additional arms 160 and 170 connecting the first member 110 and the second member 120 to a second end 132 of the strip 130. The first and second members 110 and 120, the strip 130, and the arms 140, 150, 160, and 170 comprise respective portions of a first layer 104 and a second layer 105. The first layer 104 is a sacrificial layer disposed on the substrate 101. The second layer 105 is a compressively strained layer disposed on the first layer 104. The second layer 105 comprises an alloy including Ge and Sn.

Figure 3:
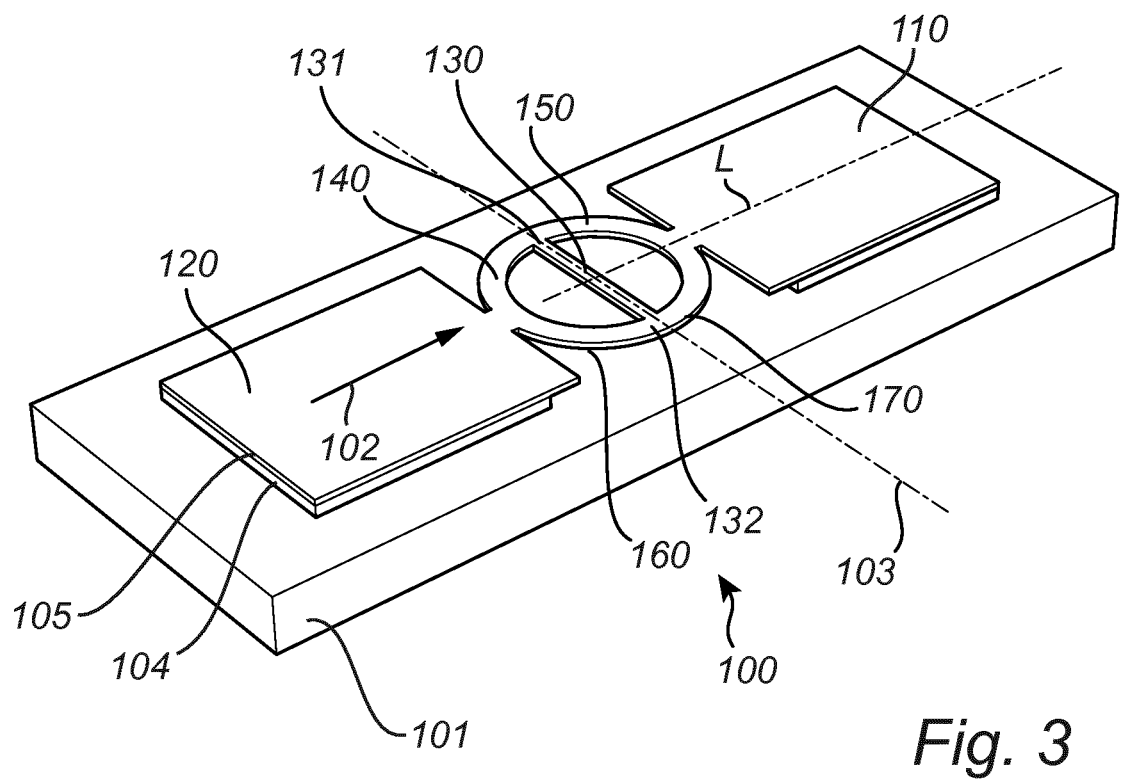
FIG. 3 is a perspective view of the structure from FIG. 1, but after removing at least a portion of a first layer, according to an embodiment
Figure 4:
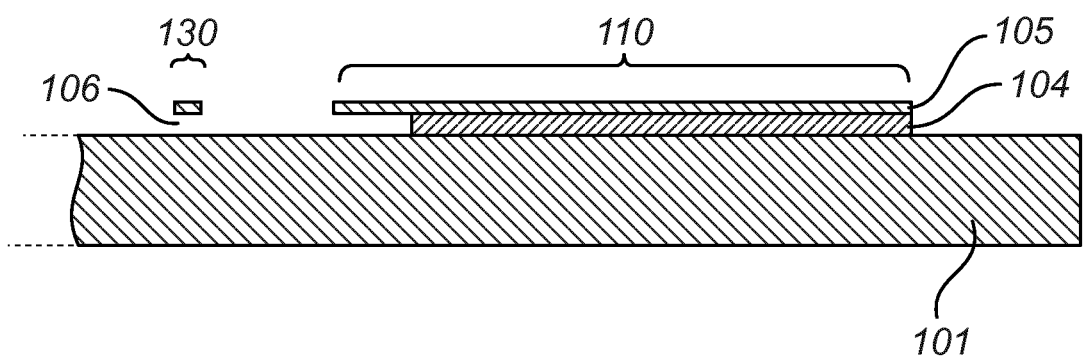
FIG. 4 is a cross sectional view of the structure in FIG. 3 along the line L.

FIG. 3 is a perspective view of the structure 100 from FIG. 1, but after removing at least a portion of the first layer 104 at the strip 130 and arms 140, 150, 160, and 170, according to an embodiment. FIG. 4 is a cross sectional view of the structure 100 in FIG. 3 along the line L. The removal of the first layer 104 at the strip 130, and the arms 140, 150, 160, and 170 causes the strip 130, and the arms 140, 150, 160, and 170 to become suspended above the substrate 101, but the arms 140, 150, 160, and 170 remain anchored to the first layer 104 via the first and second members 110 and 120.

Figure 5:
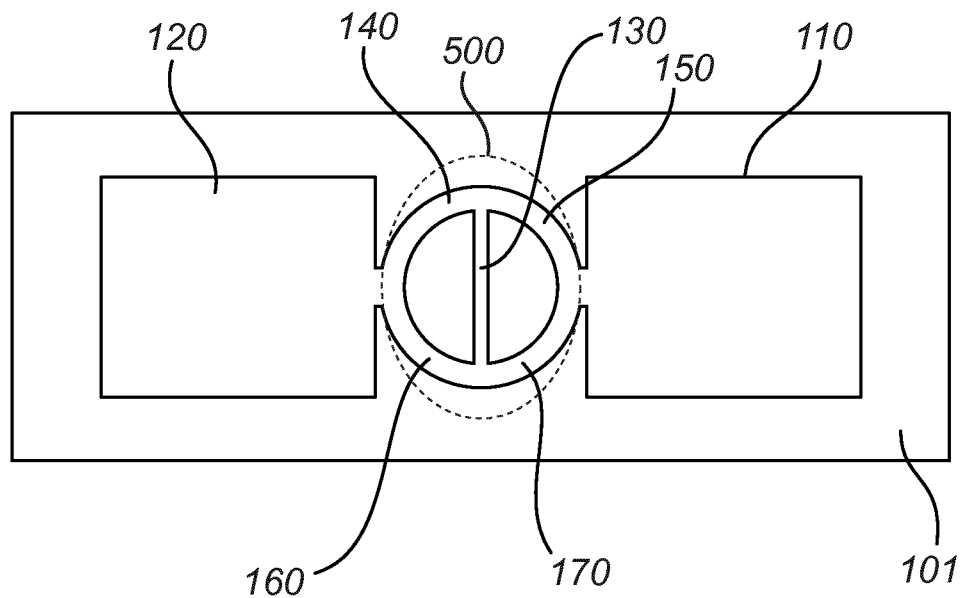
FIG. 5 is a top view of the structure 100 from FIG. 1 (solid lines) and from FIG. 2 (dashed lines)

FIG. 5 is a top view of the structure 100. The solid lines show the shape of the structure 100 before the removal of the first layer 104 at the strip 130, and the arms 140, 150, 160, and 170, which corresponds to the shape of the structure 100 in FIG. 1. The dashed lines 500 show how the structure 100 looks after the removal of the first layer 104 at the strip 130, and the arms 140, 150, 160, and 170, and this corresponds to the shape of the structure 100 in FIG. 2. When the first layer 104 is removed below the strip 130 and the arms 140, 150, 160 and 170, the compressive strain in the second layer 105 is released. The release of compressive strain causes the strip 130 and arms 140, 150, 160 and 170 to lengthen. In the present embodiment, the arms 140, 150, 160 and 170 form a circle (or loop) around the strip 130. The release of compressive strain causes the ring to expand. Since the arms 140, 150, 160, 170 are anchored to the first layer via the first and second members 110 and 120, the circle cannot grow in the direction 102, and therefore grows only along the axis 103 so that it becomes oval. The deformation of the circle causes the circle to grow more in the axial direction 103 than the strip 130 would grow by itself when the first layer 104 is removed. Hence, the arms 140, 150, 160 and 170 pull at the ends 131 and 132 of the strip 130 such that tensile strain is induced in the strip 130 along the axis 103.

The tensile strain induced in the GeSn layer 105 of the strip 130 causes the GeSn to become direct bandgap material, which may for example emit and detect light in the infrared (IR) range. Hence, the direct bandgap tensile strained GeSn may for example be used as infrared IR lasers or sensors in many different applications, from IR cameras for bio and military applications to on-chip light sources for optical data transfer between processor cores. The direct bandgap tensile strained GeSn may for example be a promising candidate for fabrication of IR camera sensors which are expensive and limited today. The structure 100 described above with reference to FIGS. 1-5 may for example be employed to produce tensile strained GeSn which is able to perform lasing at higher temperatures (for example as high as regular room temperature) than the earlier solution described in the background section.

Previously proposed bandgap group IV semiconductors (such as those mentioned in the background section) are just at the border of the transition between direct bandgap and indirect bandgap, which may be one reason for the low efficiency of light emissions. The structure 100 described above with reference to FIGS. 1-5 may be employed to provide tensile strained GeSn having an energy band gap structure deep in the direct bandgap region. More specifically, the tensile strained GeSn may have more than 0.1 eV difference between direct and indirect bandgap.

The removal of the first layer 104 at the strip 130 and the arms 140, 150, 160 and 170 may for example be performed by selective etching, which does not, or at least very little in comparison to the first layer, remove the second layer 105, but removes those parts of the first layer 104 that are exposed. Since the first and second portions 110 and 120 are larger (or wider), portions of the first layer 104 remain after the selective etching, while the first layer 104 has been removed completely (or at least sufficiently) at the strip 130, and the arms 140, 150, 160, 170. This is illustrated in FIG. 4 where open space 106 separates the second layer 105 in the strip 130 from the substrate 101, while part of the first layer 104 remains at the first member 110.

Figure 6:
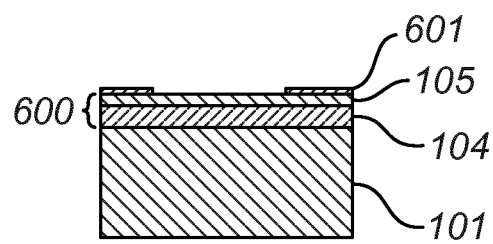
FIGS. 6-8 illustrate a process for obtaining the structure shown in FIGS. 1 and 2, according to an embodiment.
Figure 7:
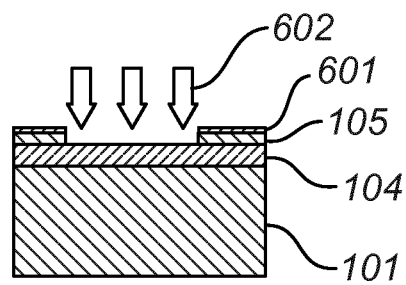
Figure 8:
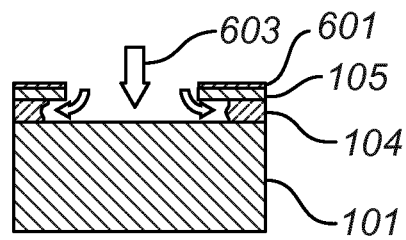

FIGS. 6-8 illustrate a process for obtaining the structure 100 shown in FIGS. 1 and 2, according to an embodiment. FIGS. 6-8 show the layers of the structure 100 from the side (cross-sectional views).

In the present embodiment, the substrate 101 is a Silicon (Si) wafer, and the first layer 104 is a Ge layer disposed on the substrate 101. The GeSn layer 105 is epitaxially grown on the Ge layer 104, and therefore becomes compressively strained. The Ge layer 104 and the GeSn layer 105 together form a stack 600 of layers. A protective layer 601 is applied on the second layer 105 in the form of a photosensitive resin. A pattern corresponding to the desired structure may then be defined in the protective layer 601 using photolithography, thereby defining which parts to protect during the subsequent etching steps. Etching 602 is then performed to form the first and second members 110 and 120, the strip 130, and the arms 140, 150, 160 and 170 in the first and second layers. Deep reactive-ion etching (DRIE) may for example be employed, using a plasma of chlorine gas to remove material from the GeSn 105. The etching 602 may for example be stopped when it reaches down to the Ge layer 104, or may continue to also remove material from the Ge layer 104.

Selective etching 603 may then be applied to remove the Ge layer 104 beneath the GeSn layer 105. The selective etching 603 may be designed to more rapidly etch Ge in comparison to GeSn. Ideally, the selective etching 603 may be designed not to remove material from the GeSn layer 105 but some etching might of course occur. Selective etching may for example be obtained using a CF4 gas in a RIE system. As described above with reference to FIG. 4, the first and second members 110 and 120 are wider (or larger) than the strip and the arms such that the selective etching 603 does not remove all of the Ge layer 104 at the first and second members 110 and 120. The strip 130 and the arms 140, 150, 160 and 170 may for example be a couple of μm wide, while the first and second members 110 and 120 may for example be tens of μm wide. In any case, the selective etching 603 causes the second layer 105 in the strip 130, and the arms 140, 150, 160 and 170 to become suspended above the substrate 101.

Using a Si wafer 101 with a Ge buffer layer 104 and an epitaxially grown GeSn layer 105, as described above withy reference to FIGS. 6-8, is advantageous in comparison to using a Germanium or Germanium on insulator (GOI) wafer, for example, because Si wafers are less expensive and less difficult to manufacture.

Thus, it will be appreciated that the substrate 101 may comprise other materials than Ge. The substrate 101 may for example be a Si wafer.

As will be described below with reference to FIGS. 10-11, the first layer 104 may comprise other materials than Ge. The first layer 104 may for example comprise an insulator material such as Si oxide or Al Oxide.

It will also be appreciated that the second layer 105 may comprise other elements in addition to Ge and Sn. The second layer 105 may for example comprise an alloy including Ge, Sn and Si. The second layer 105 (or portions thereof) may for example be n-doped or p-doped.

Figure 9:
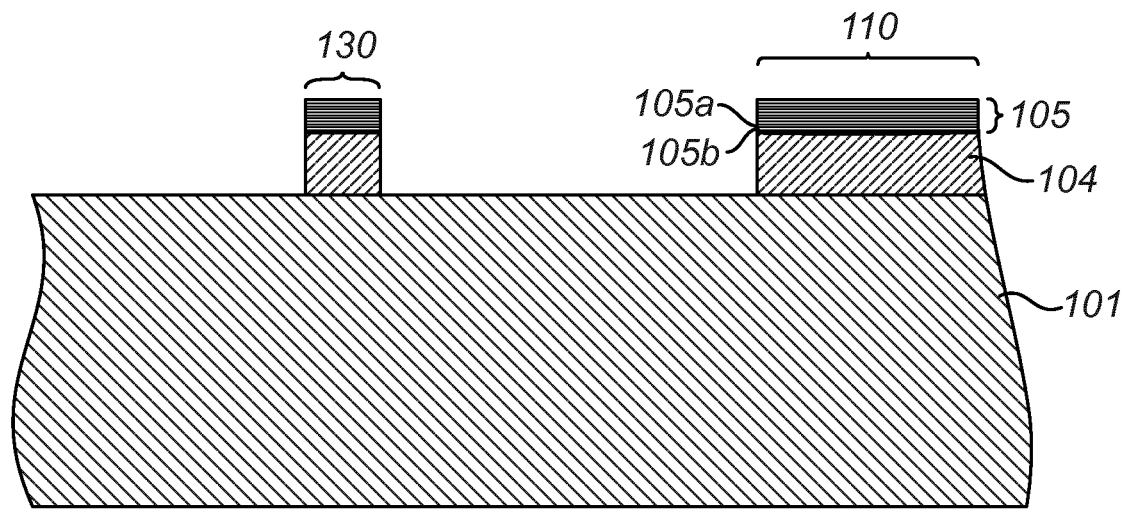
FIG. 9 is a cross sectional view of an alternative version of the structure from FIG. 1 including a multiple quantum well (MQW), according to an embodiment.

FIG. 9 is a cross sectional view of an alternative version 900 of the structure 100, according to an embodiment. The cross section showed in FIG. 9 is taken along the line L in FIG. 1. In the present embodiment, the second layer 105 includes a plurality of sublayers arranged as a stack of sublayers of a first type 105a and sublayers of a second type 105b disposed sequentially on top of each other. In other words, every second sublayer is of the first type 105a and every second sublayer is of the second type 105b. In the present embodiment, the first type of sublayers 105a are Ge sublayers 105a, and the second type of sublayers 105b are GeSn sublayers 105b. The stack of layers forms a multiple quantum well (MQW). By keeping the GeSn sublayers 105b thin, defects in the crystal structure may be avoided. The GeSn sublayers 105b may for example be 25 nm thick. The Ge sublayers 105a may for example be 25 nm thick.

To protect the Ge sublayers 105a during the selective etching of the Ge layer 104, the Ge sublayers 105a may for example be protected by an oxide 105c (not shown in FIG. 9). Before the selective etching, the GeSn sublayers 105b are under compressive stress, which is released when the Ge layer 104 is removed via the selective etching. The arms 140, 150, 160, and 170 then pull at the ends of the strip 130 such that tensile strain is induced in the GeSn sublayers 105b in the strip 130.

Figure 10:
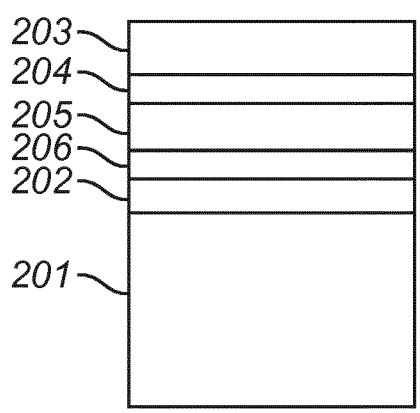
FIGS. 10-11 illustrate how wafer bonding and etch back may be employed to provide a stack like the one shown in FIG. 6.
Figure 11:
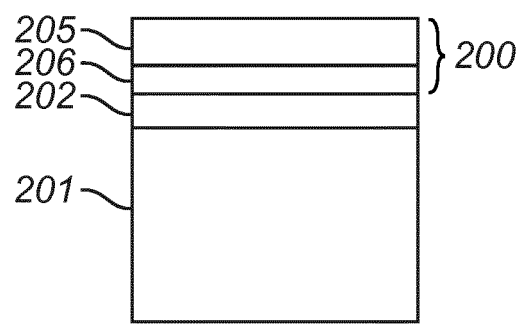

FIGS. 10-11 illustrate how wafer bonding and etch back may be employed to provide a stack 200 like the stack 600 described with reference to FIG. 6, but with layers of other materials. FIG. 10 is a side view of two wafers illustrating wafer bonding. A first Si substrate 201 is provided with a Si oxide layer 202. Another Si substrate 203 is provided with a Ge layer 204, a GeSn layer 205, and a Ge oxide layer 206. The GeSn layer 205 has been epitaxially grown on the Ge layer 204 and is therefore compressively strained. The second substrate 203 and its layers 204-206 have been placed over the first substrate 201 and its oxide layer 202 so that the two oxide layers 202 and 206 are in physical contact and the two stacks can be bonded together. FIG. 11 is a side view of the structure shown in FIG. 10 after the second Si substrate 202, and the Ge layer 204 have been removed via etching. Although the Ge layer 204 has been removed, the compressive strain in the GeSn layer 205 is maintained by the Ge oxide 206 layer.

The GeSn layer 205 and the Ge oxide layer 206 form a stack 200 which may be employed in the same way as the stack 600 described above with reference to FIG. 6. More specifically, the first and second members 110 and 120, the strip 130, and the arms 140, 150, 160 and 170 may be formed by etching the stack 600. The Ge oxide layer 206 may act as a sacrificial layer (in analogy with the first layer 104 described above with reference to FIGS. 1-8) which is selectively etched away to release the compressive strain in the GeSn layer 205 in the strip 130, and arms 140, 150, 160 and 170. The GeSn layer 205 in the strip 130 is then subjected to tensile strain in the same way as the GeSn layer 105 described above with reference to FIGS. 1-8.

The ring-shaped structure 100 described above with reference to FIGS. 1-5 is merely one of several possible ways to induce tensile strain in an alloy including Ge and Sn. Differently shaped arms may also be designed to pull at the ends of the strip 130 when the compressive strain of the second layer 105 is released. FIGS. 12-15 are top views of differently shaped structures for inducing tensile strain in a GeSn layer, according to some embodiments.

Figure 12:
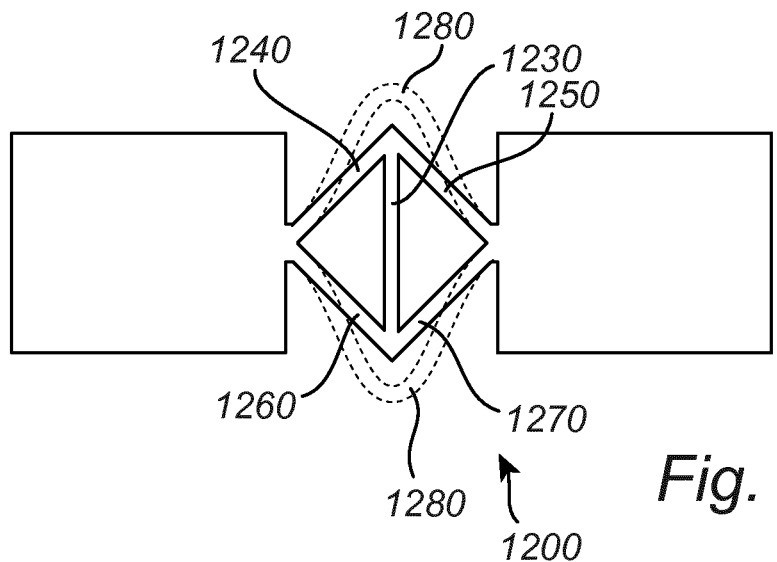
FIGS. 12-15 are top views of differently shaped structures for inducing tensile strain in a GeSn layer, according to some embodiments.

In FIG. 12, the structure 1200 has straight arms 1240, 1250, 1260 and 1270 forming a diamond shape around the strip 1230. The solid lines show the shape of the structure 1200 before the removal of the first layer 104 at the strip 1230, and the arms 1240, 1250, 1260, and 1270. The dashed lines 1280 show how the structure 1200 looks after the removal of the first layer 104 at the strip 1230, and the arms 1240, 1250, 1260, and 1270. The arms 1240, 1250, 1260, and 1270 bend somewhat when the tensile strain is released, as shown by the dashed lines 1280.

In the present embodiment, the arms extend diagonally (at an angle of 45 degrees) from the first and second members 1210 and 1220 to the ends of the strip 1230 before the compressive strain in the second layer 105 is released. However, other angles may also be envisaged. Simulations show that an angle of about 45 degrees may be a suitable tradeoff between different factors influencing the amount of tensile strain induced at the strip 1230 (such as bending of the arms, and the ratio between the length of the arms and the length of the strip).

Figure 13:
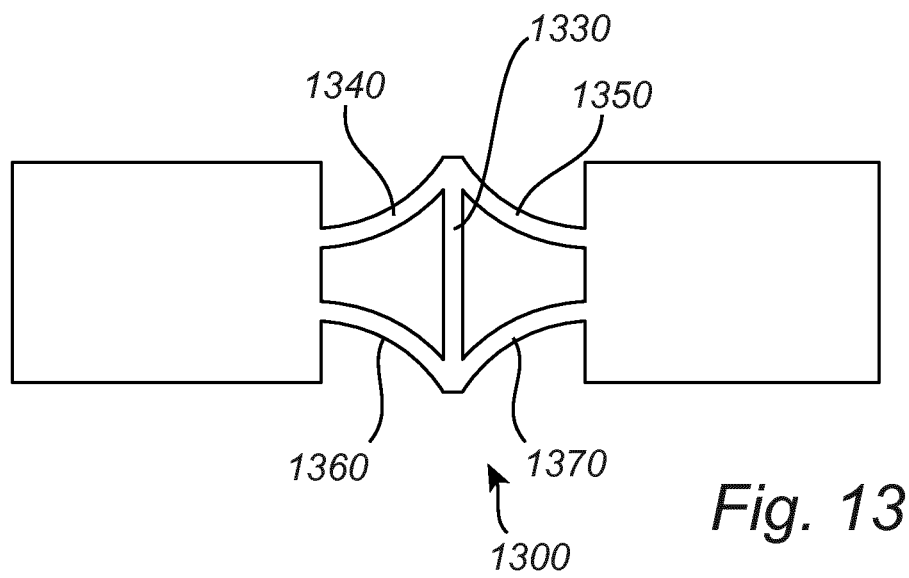

In FIG. 13, the structure 1300 has curved arms 1340, 1350, 1360 and 1370 forming a reversed (or inverted) ring shape around the strip 1330.

Figure 14:
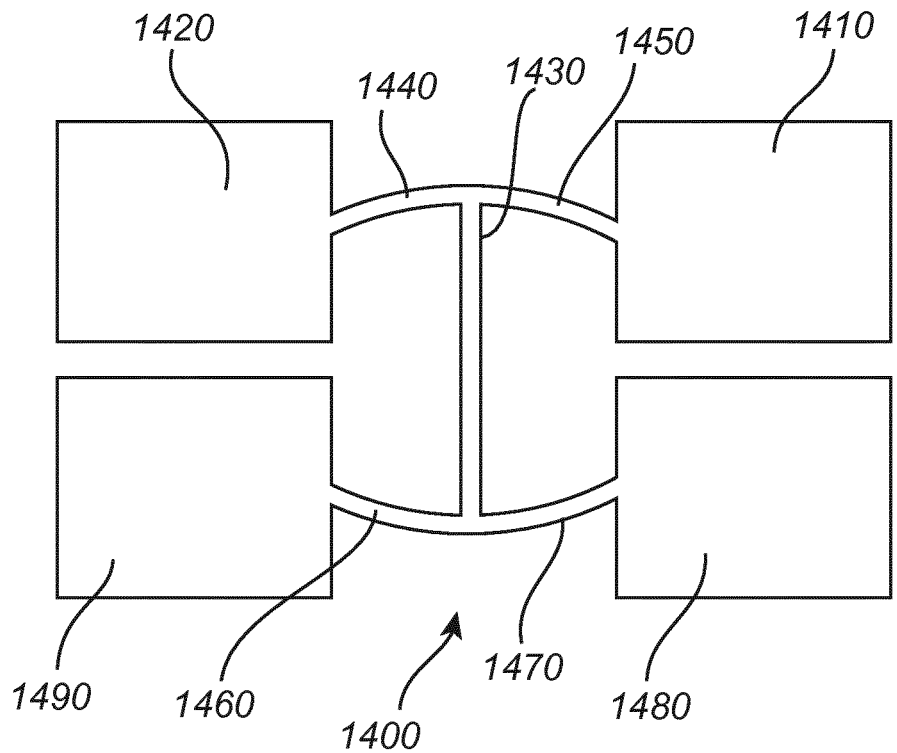

In FIG. 14, the arms 1440, 1450, 1460, 1470 of the structure 1400 do not form a closed loop around the strip 1430. Instead, two of the arms 1440 and 1450 connect one end of the strip 1430 to first and second members 1410 and 1420, and the other two arms 1460 and 1470 connect the other end of the strip 1430 to third and fourth members 1480 and 1490. The first, second, third and fourth members 1460, 1470, 1480 and 1490 are separate from one to another.

Figure 15:
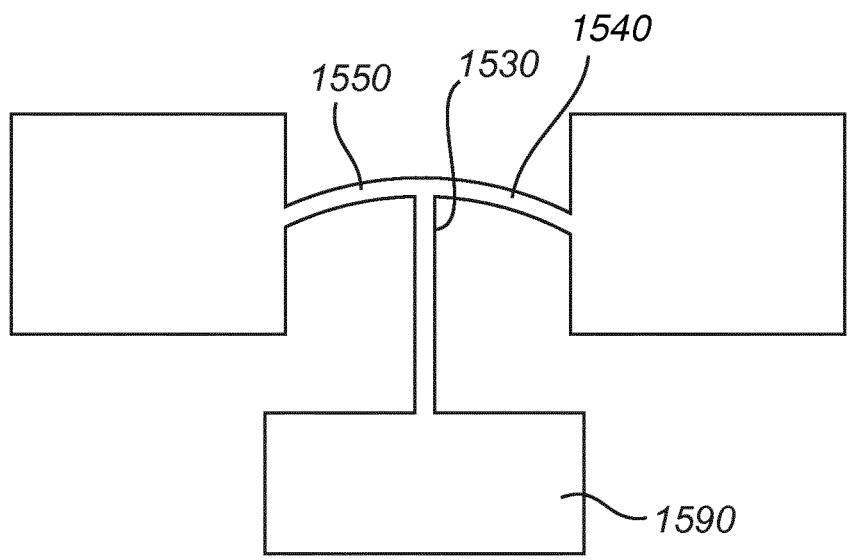

The structure 1500 shown in FIG. 15 is similar to one half of the structure 1400 described above with reference to FIG. 10. The other half of the structure 1400 has been replaced by an anchoring member 1590 connected to an end of the strip 1530 for anchoring the strip 1530 to the first layer 104. The arms 1540 and 1550 therefore pull at one end of the strip 1530, while the other end of the strip 1530 is held in place by the anchoring member 1590.

The structures described above with reference to FIGS. 1-15 provide the benefit of inducing strain to the active GeSn layer 105 using a relatively small area of a chip. For example, a circle (such as the one formed by the arms in FIG. 1) of radius 10 μm may be sufficient to provide a 1 μm wide strip (or wire) with 6 μm length.

The wire 130 described above with reference to FIG. 1-5 may for example be between 0.1 µm and 10 µm wide. The wire 130 may for example be between 1 µm and 50 µm long. The structure 100 may for example fit within a square shaped area of less than 50 µm times 50 µm, for example 20 µm times 20 µm.

The first layer 104 may for example be between 10 nm and 5 µm thick. The second layer 105 may for example be between 100 nm and 5 µm thick.

The person skilled in the art realizes that the present invention is by no means limited to the preferred embodiments described above. On the contrary, many modifications and variations are possible within the scope of the appended claims. For example, it will be appreciated that arms of different shapes than those shown in FIGS. 1-15 may be employed. Additionally, variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A manufacturing method comprising:
   providing a structure disposed on a substrate, the structure having first and second layers, wherein the first layer is a sacrificial layer, wherein the second layer is a compressively strained layer disposed on the first layer and the second layer includes a plurality of sublayers arranged as a stack of sublayers of a first type and sublayers of a second type disposed sequentially on top of each other, and wherein the first type of sublayers are germanium sublayers and the second type of sublayers comprise an alloy including germanium and tin, the structure comprising:
      first and second members spaced a distance from each other along a direction,
      a strip located between the first and second members and extending along an axis intersecting said direction, and
      arms connecting the first and second members to a first end of the strip, wherein the first and second members, the strip and the arms comprise respective portions of the first and second layers; and
   removing at least a portion of the first layer at the strip and arms such that the strip and arms become suspended and the arms remain anchored to the first layer via the first and second members.

2. The method of claim 1, wherein the removal of at least a portion of the first layer causes at least part of the compressive strain in the second layer of the strip and arms to be released, and wherein the release of compressive strain causes the arms to lengthen and to pull at the first end of the strip such that tensile strain is induced in the strip along said axis.

3. The method of claim 1, wherein providing said structure comprises:
   providing a substrate on which the first and second layers are disposed; and
   removing material via etching from at least the second layer to form at least the strip, the arms, and the first and second members in at least the second layer.

4. The method of claim 1, wherein the removal of at least a portion of the first layer is performed via selective etching of the first layer.

5. The method of claim 1, wherein the first layer is a germanium layer or an insulator layer.

6. The method of claim 1, wherein the structure further comprises additional arms connecting the first and second members to a second end of the strip, wherein the additional arms comprise respective portions of the first and second layers, the method comprising:
   removing at least a portion of the first layer at the strip, arms, and additional arms such that the strip, arms, and additional arms become suspended and the arms and the additional arms remain anchored to the first layer via the first and second members.

7. The method of claim 1, wherein the structure further comprises an anchoring member connected to a second end of the strip, wherein the anchoring member comprises portions of the first and second layers, the method comprising:
   removing at least a portion of the first layer at the strip and arms such that the strip and arms become suspended, the strip remains anchored to the first layer via the anchoring member, and the arms remain anchored to the first layer via the first and second members.

8. A manufacturing method comprising:
   providing a structure disposed on a substrate, the structure having first and second layers, wherein the first layer is a sacrificial layer, and wherein the second layer is a compressively strained layer disposed on the first layer, the second layer comprising an alloy including germanium and tin, the structure comprising:
      first and second members spaced a distance from each other along a direction,
      a strip located between the first and second members and extending along an axis intersecting said direction,
      third and fourth members spaced a distance from each other along said direction, the strip being located between the third and fourth members, and
      arms connecting the first and second members to a first end of the strip and additional arms connecting the third and fourth members to a second end of the strip, wherein the first and second members, the strip, the third and fourth members, the arms, and the additional arms comprise respective portions of the first and second layers; and
   removing at least a portion of the first layer at the strip, arms, and additional arms such that the strip, arms, and additional arms become suspended, the arms remain anchored to the first layer via the first and second members, and the additional arms remain anchored to the first layer via the third and fourth members.

9. A device comprising a substrate and a structure disposed on the substrate, wherein the structure comprises:
   first and second members spaced a distance from each other along a direction;
   a strip located between the first and second members and extending along an axis intersecting said direction; and
   arms connecting the first and second members to a first end of the strip,
   wherein the first and second members comprise respective portions of a first layer, wherein the first layer is a sacrificial layer, wherein the first and second members, the strip and the arms comprise respective portions of a second layer, wherein the second layer includes a plurality of sublayers arranged as a stack of sublayers of a first type and sublayers of a second type disposed sequentially on top of each other, wherein the first type of sublayers are germanium sublayers and the second type of sublayers comprise an alloy including germanium and tin, wherein the portions of the second layer located in the first and second members are disposed on the respective portions of the first layer located in the first and second members, wherein the portions of the second layer located in the first and second members are compressively strained, wherein the strip and arms are suspended above the substrate, and wherein the arms are anchored to the first layer via the first and second members.

10. The device of claim 9, wherein the arms pull at the first end of the strip such that tensile strain is induced in the strip along said axis.

11. The device of claim 9, wherein the substrate is arranged along a plane, and wherein said direction and said axis are both parallel to said plane.

12. The device of claim 9, wherein the structure further comprises:
additional arms connecting the first and second members to a second end of the strip, wherein the additional arms comprise respective portions of the second layer, and wherein the additional arms are suspended above the substrate and are anchored to the first layer via the first and second members.

13. The device of claim 9, wherein the structure further comprises an anchoring member connected to a second end of the strip, wherein the anchoring member comprises portions of the first and second layers, wherein the portion of the second layer located in the anchoring member is disposed on the portion of the first layer located in the anchoring member, wherein the portion of the second layer located in the anchoring member is compressively strained, and wherein the second end of the strip is anchored to the first layer via the anchoring portion.

14. The device of claim 9, wherein:
the second layer is at most 400 nm thick; or
the second layer comprises a sublayer which is at most 400 nm thick, said sublayer comprising an alloy including germanium and tin.

15. The device of claim 9,
wherein the structure occupies an area of less than 50 μm times 50 μm;
wherein a distance between the first member and the second member is less than 2 times a length of the strip; or
wherein the strip is between 0.1 μm and 10 μm wide.

16. The device of claim 9, wherein:
the second layer has at least 5 atomic percent tin; or
the second layer comprises a sublayer which has at least 5 atomic percent tin, said sublayer comprising an alloy including germanium and tin.

17. An infrared laser device comprising the device of claim 9, wherein the strip is arranged to be employed as an infrared light source.

18. A photodetector comprising the device of claim 9, wherein the strip is arranged to be employed as an infrared absorber.

19. A device comprising a substrate and a structure disposed on the substrate, wherein the structure comprises:
first and second members spaced a distance from each other along a direction;
a strip located between the first and second members and extending along an axis intersecting said direction;
arms connecting the first and second members to a first end of the strip, wherein the first and second members comprise respective portions of a first layer, wherein the first layer is a sacrificial layer, wherein the first and second members, the strip and the arms comprise respective portions of a second layer, wherein the second layer comprises an alloy including germanium and tin, wherein the portions of the second layer located in the first and second members are disposed on the respective portions of the first layer located in the first and second members, wherein the portions of the second layer located in the first and second members are compressively strained, wherein the strip and arms are suspended above the substrate, and wherein the arms are anchored to the first layer via the first and second members;
third and fourth members spaced a distance from each other along said direction, wherein the strip is located between the third and fourth members, the third and fourth members comprising respective portions of the first and second layers, wherein the portions of the second layer located in the third and fourth members are disposed on the respective portions of the first layer located in the third and fourth members, and wherein the portions of the second layer located in the third and fourth members are compressively strained; and
additional arms connecting the third and fourth members to a second end of the strip, wherein the additional arms comprise respective portions of the second layer, and wherein the additional arms are suspended above the substrate and are anchored to the first layer via the third and fourth members.

* * * * *